(12) United States Patent
Sung

(10) Patent No.: US 10,466,304 B2
(45) Date of Patent: Nov. 5, 2019

(54) METHOD FOR ESTIMATING A BATTERY STATE OF HEALTH

(71) Applicant: HYUNDAI MOTOR COMPANY, Seoul (KR)

(72) Inventor: Woo Suk Sung, Hwaseong-si (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 218 days.

(21) Appl. No.: 15/371,986

(22) Filed: Dec. 7, 2016

(65) Prior Publication Data

US 2018/0106868 A1    Apr. 19, 2018

(30) Foreign Application Priority Data

Oct. 19, 2016    (KR) .................... 10-2016-0135852

(51) Int. Cl.
*G01R 31/367*    (2019.01)
*G01R 31/392*    (2019.01)
(Continued)

(52) U.S. Cl.
CPC .............. *G01R 31/367* (2019.01); *B60L 3/12* (2013.01); *B60L 58/12* (2019.02); *B60L 58/16* (2019.02); *G01R 31/392* (2019.01); *B60L 2240/547* (2013.01); *B60L 2240/549* (2013.01); *B60L 2260/44* (2013.01); *B60L 2260/46* (2013.01); *G01R 31/3835* (2019.01)

(58) Field of Classification Search
CPC ............ G01R 31/3651; G01R 31/3679; G01R 31/362; G01R 31/36
See application file for complete search history.

(56) References Cited

U.S. PATENT DOCUMENTS 7,615,967 B2    11/2009    Cho et al.
8,922,168 B2    12/2014    Ko
(Continued)

FOREIGN PATENT DOCUMENTS

JP    H1152033    2/1999
JP    2007187638 A    7/2007
(Continued)

OTHER PUBLICATIONS

Plett, "Recursive approximate weighted total least squares estimation of battery cell total capacity", Sep. 29, 2010, Journal of Power Sources 196 (2011) 2319-2331 (Year: 2010).*
(Continued)

*Primary Examiner* — Stephanie E Bloss
(74) *Attorney, Agent, or Firm* — Lempia Summerfield Katz LLC

(57) ABSTRACT

A method for estimating a state of health of a battery includes calculating a measured value of a charging required time for each of preset voltage intervals in a preset voltage range in which the battery is charged; calculating an estimated value of the charging required time for each of the voltage intervals by a preset battery meta-model; and estimating the SOH having lowest error between the measured value of the charging required time and the estimating value of the charging required time by allowing the estimated value of the charging required time to iteratively approach the measured value of the charging required time.

12 Claims, 16 Drawing Sheets

(51) Int. Cl.
  *B60L 3/12* (2006.01)
  *B60L 58/16* (2019.01)
  *B60L 58/12* (2019.01)
  *G01R 31/3835* (2019.01)

(56) References Cited

U.S. PATENT DOCUMENTS

| | | | |
|---|---|---|---|
| 9,395,419 B2 | 7/2016 | Park et al. | |
| 2006/0284600 A1* | 12/2006 | Verbrugge | G01R 31/367 |
| | | | 320/132 |
| 2010/0036626 A1* | 2/2010 | Kang | G01R 31/3648 |
| | | | 702/63 |
| 2013/0134778 A1 | 5/2013 | Tamanaha | |
| 2013/0185007 A1* | 7/2013 | Imre | H01M 10/4207 |
| | | | 702/63 |
| 2013/0346001 A1 | 12/2013 | Park et al. | |
| 2014/0244225 A1* | 8/2014 | Balasingam | G06F 17/5036 |
| | | | 703/2 |
| 2015/0349385 A1* | 12/2015 | Hu | H01M 10/48 |
| | | | 429/91 |
| 2016/0003917 A1* | 1/2016 | You | G01R 31/392 |
| | | | 702/63 |
| 2016/0107537 A1 | 4/2016 | Marchal et al. | |
| 2016/0187428 A1* | 6/2016 | Basu | G01R 31/392 |
| | | | 702/63 |
| 2016/0187432 A1 | 6/2016 | Saint-Marcoux et al. | |

FOREIGN PATENT DOCUMENTS

| | | |
|---|---|---|
| JP | 2009500603 A | 1/2009 |
| JP | 2013115863 A | 6/2013 |
| JP | 2015065716 A | 4/2015 |
| KR | 1020110111018 A | 10/2011 |
| KR | 20130089360 | 8/2013 |
| KR | 20130125141 | 11/2013 |
| KR | 101419130 B1 | 7/2014 |
| KR | 1020160003237 A | 11/2014 |
| KR | 1020160004077 | 1/2016 |
| KR | 1020160012355 A | 2/2016 |
| WO | 20150015083 A1 | 2/2015 |

OTHER PUBLICATIONS

Tong et al, "Battery state of charge estimation using a load-classifying neural network", Jul. 29, 2016, Journal of Energy Storage 7 (2016) 236-243 (Year: 2016).*

* cited by examiner

METHOD FOR ESTIMATING A BATTERY STATE OF HEALTH

CROSS-REFERENCE TO RELATED APPLICATION

This application is based on and claims the benefit of priority to Korean Patent Application No. 10-2016-0135852, filed on Oct. 19, 2016 in the Korean Intellectual Property Office, the disclosure of which is incorporated herein in its entirety by reference.

TECHNICAL FIELD

The present disclosure relates to a method for estimating a state of health (SOH) of a battery, and more particularly, to a method for estimating a state of health (SOH) of a battery for reducing a mismatching phenomenon between actual capacity of the battery and a stored SOH of the battery.

BACKGROUND

An electric vehicle or a hybrid electric vehicle (hereinafter, collectively referred to as 'electric vehicle') may be driven using electric energy of a battery in an electric drive mode. However, since such battery is a secondary battery and a function thereof is degraded as the battery repeats a charging/discharging, a degree of degradation thereof needs to be evaluated.

A state of health (SOH), which is a parameter quantitatively indicating characteristic change of capability of the battery due to an aging effect, is an index indicating how much the capacity of the battery has been degraded. The SOH is used to adjust charging/discharging capacity of the battery according to a replacement time point of the battery and a use time of the battery.

The characteristic change of the capacity of the battery may be estimated by internal resistance and temperature of the battery. Accordingly, according to the related art, after the capacity of the battery for each of the internal resistance and the temperature of the battery is measured in advance through a charging/discharging experiment, and a look-up table for mapping the SOH by relatively digitizing measurement capacity to initial capacity is obtained, the SOH corresponding to the internal resistance and the temperature of the battery was estimated.

In this case, since it is difficult to directly measure the internal resistance of the battery in a charging/discharging operation of the battery, a technology capable of accurately measuring the internal resistance of the battery is required.

In brief, the internal resistance of the battery may be indirectly calculated by applying Ohm's law to measured values of a voltage and a charging/discharging current of the battery. However, since the measured value of the voltage of the battery has a difference from an actual voltage due to an IR drop phenomenon of the battery, and the current of the battery also have a measurement difference, the SOH calculated by Ohm's law has large error.

As another method for estimating the SOH according to the related art for reducing the SOH error, there is a method for estimating a state of charge (SOC) of the battery by integrating the charging/discharging current of the battery, and estimating the SOH using the estimated SOC. However, the above-mentioned method had a problem that the measurement error occurring in an operation of measuring the current is accumulated and accuracy of the SOC used as basic data of the estimation of the SOH is decreased over time, which results in a degradation of reliability of the estimation of the SOH.

SUMMARY

The present disclosure has been made to solve the above-mentioned problems occurring in the prior art while advantages achieved by the prior art are maintained intact.

An aspect of the present disclosure provides a method for estimating an aging state of a battery and estimating a state of health (SOH) of a battery having low error between a measured value of a charging required time and an estimated value of the charging required time by allowing the estimated value of the charging required time to iteratively approach the measured value of the charging required time such as a fixed-point iteration, and more particularly, provides a method for estimating an SOH of a battery capable of estimating the SOH of the battery even through there is no stored information on the SOH of the battery.

Other objects and advantages of the present disclosure can be appreciated by the following description and will be clearly described by the embodiments of the present disclosure. The objects and advantages of the present disclosure can be implemented by the embodiments described in the appended claims and combinations thereof.

According to an exemplary embodiment of the present disclosure, a method for estimating a state of health of a battery includes calculating a measured value of a charging required time for each of preset voltage intervals in a preset voltage range in which the battery is charged; calculating an estimated value of the charging required time for each of the voltage intervals by a preset battery meta-model; and estimating the SOH having lowest error between the measured value of the charging required time and the estimating value of the charging required time by allowing the estimated value of the charging required time to iteratively approach the measured value of the charging required time.

The preset voltage range may be 3650 mV to 3950 mV, and the voltage interval may be 25 mV.

The estimating of the SOH may include obtaining an initial measured value of the charging required time; initializing the estimated SOH to 1; estimating a charging start time of the battery; and updating the initial measured value to which the charging start time is added to the measured value of the charging required time.

The method may further include: after the updating of the initial measured value to the measured value of the charging required time, estimating an estimated value of the charging required time using the battery meta-model; calculating a residuals vector by subtracting the measured value of the charging required time from the estimated value of the charging required time; and updating the estimated SOH that a weighted least square sum of the residuals vector is the minimum.

In the calculating of the measured value of the charging required time, cells having lowest, average, and maximum voltages among all cells configuring the battery may be selected, and the charging required time for each of the voltage intervals may be measured for the three selected cells, respectively.

In the estimating of the SOH having the lowest error between the measured value of the charging required time and the estimating value of the charging required time, the SOH of the battery may be estimated for the three selected cells, respectively, and an SOH of the cell having the maximum voltage may be determined as the SOH.

The method may further include calculating a charging start time of the charging required time by converting a result obtained by dividing residual capacity by a charging current into a unit of second, before performing a constant current charging for the battery.

The calculating of the estimated value of the charging required time may include calculating the estimated value of the charging required time by changing a charging curve of a predicted SOH so as to correspond to a charging start time.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
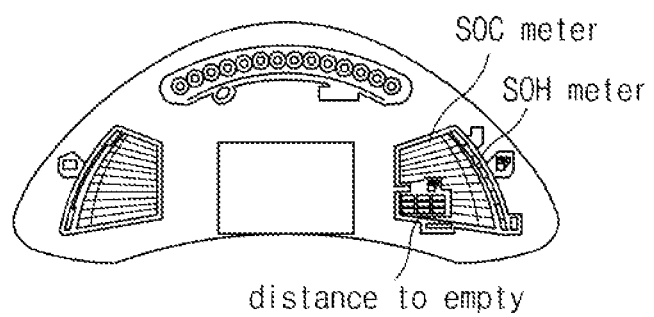
FIG. 1 is a view illustrating an example of a SOC meter and an SOH meter.

Advantages and features of the present disclosure and methods to achieve them will be set forth by exemplary embodiments described below in detail with reference to the accompanying drawings. However, the present disclosure is not limited to the exemplary embodiments set forth herein, but may be modified in many different forms. Merely, the exemplary embodiments of the present disclosure will be provided to describe the spirit of the present disclosure in detail so that those skilled in the art may easily implement the spirit of the present disclosure.

In the drawings, the exemplary embodiments of the present disclosure are not limited to illustrated specific forms, but are exaggerated for clarity. In the present specification, specific terms have been used, but are just used for the purpose of describing the present disclosure and are not used for qualifying the meaning or limiting the scope of the present disclosure, which is disclosed in the appended claims.

In the present specification, an expression 'and/or' is used as a meaning including at least one of components listed before and after the expression. In addition, an expression 'connected to or coupled to' is used as a meaning including a case in which one component is directly connected to another component or is indirectly connected through another component. Unless explicitly described to the contrary, a singular form includes a plural form in the present specification. In addition, components, steps, operations, and elements mentioned by 'comprise' or 'comprising' used in the present specification mean the existence or addition of one or more other components, steps, operations, and elements.

Hereinafter, exemplary embodiments of the present disclosure will be described in detail with reference to the accompanying drawings.

Before describing a configuration of the present disclosure, a theoretical concept of the present disclosure will be briefly described.

A concept of estimating a state of health (SOH) according to an exemplary embodiment of the present disclosure will be described with reference to FIGS. 1 to 2B.

Figure 2A:
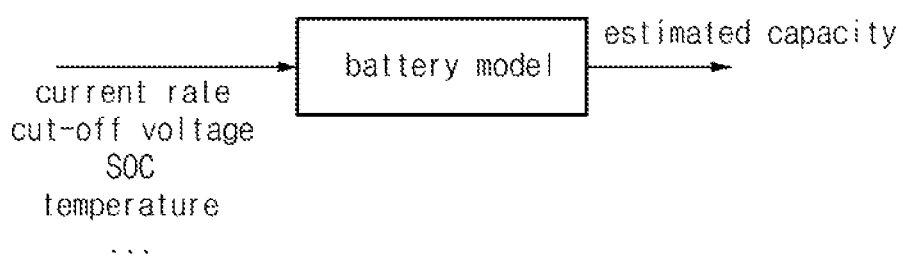
FIGS. 2A and 2B are views illustrating examples of an open loop battery model and a closed loop battery model.
Figure 2B:
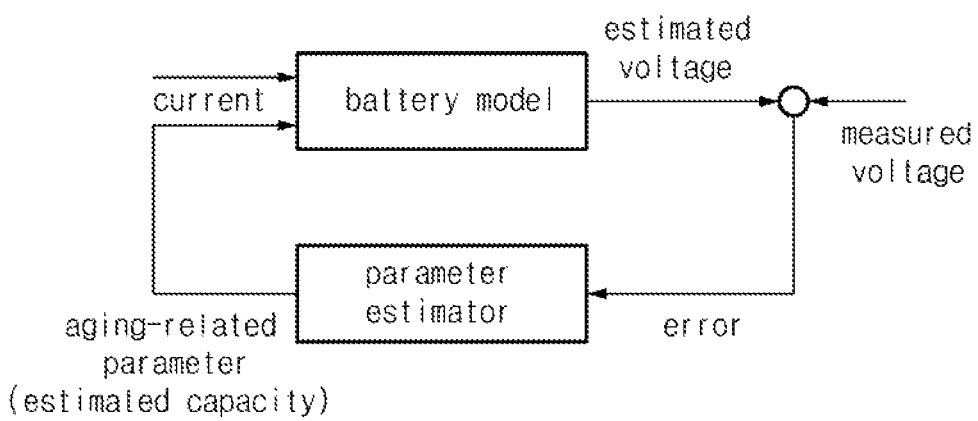

FIG. 1 is a view illustrating an SOC meter and an SOH meter and FIGS. 2A and 2B are views illustrating an open loop battery model and a closed loop battery model.

Certain variables in a battery management are a state of charge (SOC) related to residual capacity of a battery and a state of health (SOH) related to an aging state of the battery.

First, the SOC may be calculated in residual capacity to present capacity as in the following Equation 1. Here, the present capacity and the residual capacity are expressed in a unit of hA.

$$SOC = \frac{\text{Residual Capacity}}{\text{Present Capacity}} \quad (1)$$

Next, the SOH may be calculated in present capacity to initial capacity as in the following Equation 2. The SOH is expressed by a value between 0 and 1, or a percentage.

$$SOH = \frac{\text{Present Capacity}}{\text{Initial Capacity}} \quad (2)$$

As such, the SOC needs to be associated with the SOH in order to provide more accurate residual capacity of the battery.

Such SOH may be monitored on an on-board in order to provide a replacement period of the battery. As an example, Nissan Leaf includes an SOC meter and an SOH meter on a dash board, as illustrated in FIG. 1.

In this case, the SOC meter is called an allowable charge gauge, and the SOH meter is called an available capacity gauge. Such SOC meter is decreased as the battery is discharged, and the SOC meter is again increased when the battery is charged, but a level of the SOH meter is continuously decreased unless the battery is replaced.

Examples of a method for estimating the SOC for estimating the SOC and the SOH described above may include an open loop method and a closed loop method.

Referring to FIG. 2A, the open loop method outputs estimated capacity without a feedback using a battery model. Therefore, in an open loop battery model, an accuracy of capacity estimation is determined by an accuracy of a system model generated by Arrhenius model. Inputs of the open loop battery model may be variables such as a charging/discharging current rate, a charging cut-off voltage, the SOC, and a temperature that affect capacity loss. However, since only one or two of the above-mentioned variables may be applied to the open loop battery model, the variables may be applied without a complex interaction between a plurality of inputs. However, the open loop battery model has a limit in showing various scenarios obtained from an actual use pattern of the battery.

Referring to FIG. 2B, a closed loop battery model outputs an estimated voltage for a feedback, and is electrical and electrochemical, and an input thereof is an aging-related parameter. Since the closed loop battery model uses a measured voltage as a desired output, it may estimate present capacity even in an actual environment condition. However, the closed loop battery model has a disadvantage that it requires more computing resources than the open loop method.

In order to reduce complexity of the battery model described above, the present disclosure has been devised based on a meta-model representing a battery operation by an internal principle of the battery. Here, since a battery operation of interest is limited to a change of a shape of a charge curve according to a battery aging, the meta-model is configured for only a charging region of the battery.

Meanwhile, in a vehicle to grid scenario, the battery of an electric vehicle (EV) is a target of a constant current charging even though magnitude of the current is different. Here, the magnitude of the current may be different depending on a power level of a charger selected by a user of the electric vehicle. Using such characteristics, according to the present disclosure, the SOH of the battery is estimated using a charging time according to the constant current charging.

Figure 3:
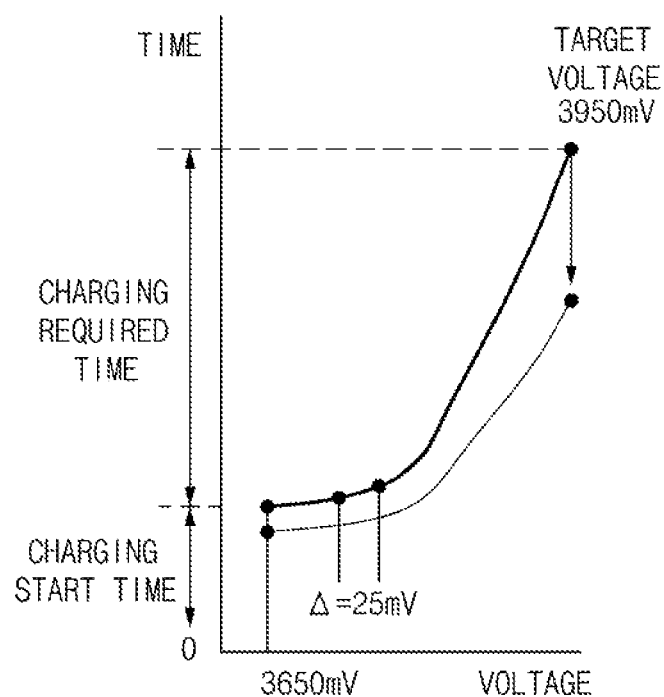
FIG. 3 is a graph illustrating a change of a battery charging curve over a voltage and a time according to an exemplary embodiment of the present disclosure.

FIG. 3 is a graph illustrating a change of a battery charging curve over a voltage and a time according to an exemplary embodiment of the present disclosure.

Referring to FIG. 3, a charging curve used for building up the battery meta-model has a form of a time according to a voltage as illustrated in FIG. 3.

Specifically, an X axis indicates the voltage, a Y axis indicates the time according to the charging of the battery, and the time according to the charging of the battery may include a charging start time and a charging elapsed time (e.g., charging required time).

As illustrated in FIG. 3, a charging start voltage is 3650 mV, a charging complete voltage is 3950 mV, and the system for estimating an SOH of a battery stores a vector y measured at every 25 mV in the charging elapsed time between the charging start voltage and the charging complete voltage.

Figure 4:
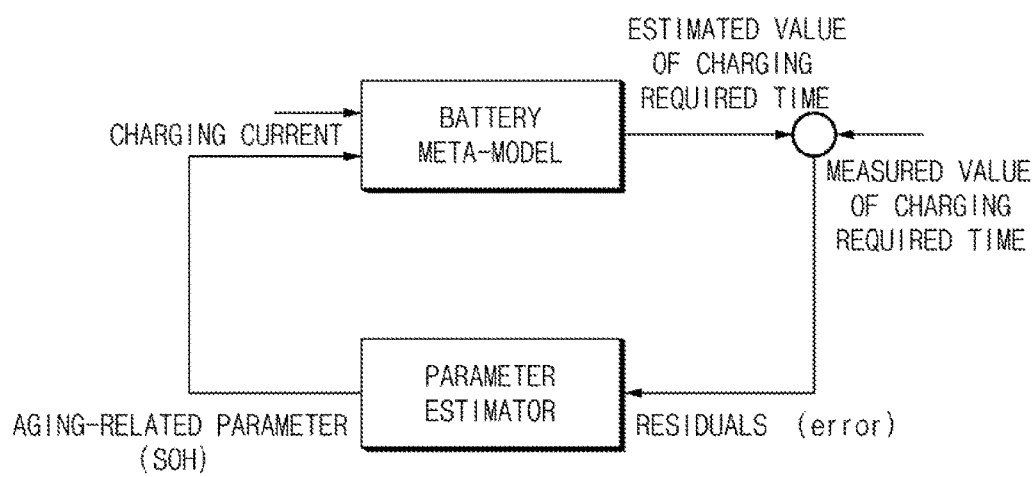
FIG. 4 is a view illustrating an operation process of a battery meta-model according to an exemplary embodiment of the present disclosure.

FIG. 4 is a view illustrating an operation process of a battery meta-model according to an exemplary embodiment of the present disclosure.

Referring to FIG. 4, the battery meta-model (or battery model) estimates the charging required time as an output for the aging-related parameter (e.g., normalization capacity=SOH), which is an output of a parameter estimator.

Accordingly, the charging curve used for building up the battery meta-model has a form of the time according to the voltage.

However, since a terminal voltage of the battery is sensitive to a duty cycle, an idle time, the SOC, and the temperature, the variables eventually distorts the form of the charging curve and affects an estimation of the parameter.

However, according to the present disclosure, it is possible to suppress other factors that may affect the form the charging curve other than the present capacity by combining a method for estimating an SOH and a weighted least square (WLS) method.

As such, according to the present disclosure, it is possible to prevent estimation error caused by a current integration and to improve reliability of the capacity estimation of the battery by replacing the current integration over time according to the related art with the WLS of error between an estimated value and a measured value of the charging required time.

Further, according to the present disclosure, it is possible to efficiently estimate the present capacity using limited calculation resources of the battery management system with a combination of the battery meta-model and the WLS.

Figure 5:
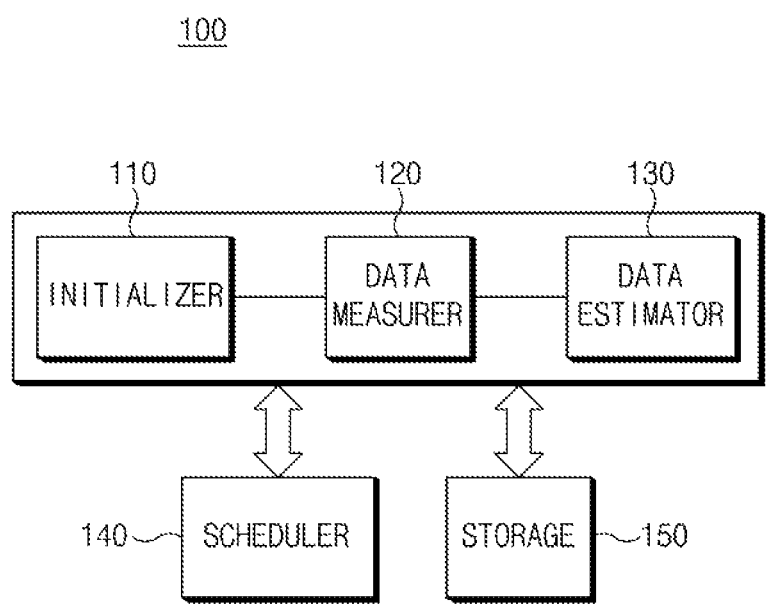
FIG. 5 is a configuration diagram illustrating a battery management system according to an exemplary embodiment of the present disclosure.

FIG. 5 is a configuration diagram illustrating a battery management system according to an exemplary embodiment of the present disclosure.

The battery management system 100 according to an exemplary embodiment of the present disclosure includes a storage 150, an initializer 110, a data measurer 120, a parameter estimator 130, and a scheduler 140. Here, the system for estimating an SOH of a battery includes the data measurer 120 and the parameter estimator 130.

The initializer 110 checks normalized capacity checked from a previous charging in the storage 150, and converts residual capacity corresponding to the normalized capacity into an initial time (e.g., the charging start time). Here, the initial time is a start point of the charging curve of the battery.

In detail, the initializer 110 may convert (e.g., *3600 [sec]) the initial time in a unit of hour calculated by dividing the residual capacity by a charging current into a unit of second as in the following Equation 3.

$$\text{Initial Time} = \frac{\text{Residual Capacity}}{\text{Charging Current}} \times 3600 \quad (3)$$

Here, the residual capacity may obtained by multiplying the normalized capacity with the SOC.

Here, the charging current may be a value measured by a current sensor of the battery management system, or may also be a value transferred by a charging station.

The data measurer 120 measures a plurality of charging required times required for a battery voltage to be changed (charged) by a preset voltage interval in a preset voltage range at the time of charging the battery, and stores a measured value in a vector y.

In this case, the voltage range and the voltage interval may be diverse, but hereinafter, an example in which the voltage range is 3650 mV to 3950 mV, and the voltage interval is 25 mV will be described as illustrated in FIG. 3.

In this case, the data measurer 120 measures a plurality of required times, which may be represented by a plurality of points of the charging curve.

The data measurer 120 may measure the charging voltage at a period (e.g., every 100 ms) allocated by the scheduler 140.

The parameter estimator 130 estimates the parameter (e.g., the SOH of the battery) after a collection of the charging required time for the preset voltage range on the charging curve is completed.

Specifically, the parameter estimator 130 calculates an estimated value of the charging required time for each of voltage intervals according to the SOH estimated by a preset battery meta-model, when the battery voltage is the preset voltage range or more. In addition, the parameter estimator 130 estimates an estimated SOH having the relatively lowest error between a measured value for each of the voltage intervals and an estimated value for each of the voltage intervals by the weighted least square method as the SOH of the battery.

The parameter estimator 130 brings the measured value of the charging required time of each of battery cells from the storage 150. In this case, the parameter estimator 130 configures a measured value vector y using data from the storage 150. Such measured value vector y may be continuously updated.

The parameter estimator 130 estimates the charging required time by the battery meta-model. Specifically, the parameter estimator 130 predicts the charging required time of each of the measurement points of the charging curve by the battery meta-model and stores the predicted charging required time in an estimated value vector x.

In this case, the parameter estimator 130 sets the estimated SOH (e.g., the predicted SOH) to 1 initially after the parameter estimation starts, and stores the charging required time, which is a result obtained by converting the charging curve of the SOH of 1 according to the calculated initial time, in the estimated value vector x.

Thereafter, the parameter estimator 130 may gradually decrease the estimated SOH to thereby store the charging required time corresponding to the charging curve in the estimated value vector x.

The parameter estimator 130 calculates an SOH estimated value by the WLS based on the charging required time. Specifically, the parameter estimator 130 subtracts the measured value vector y from the estimated value vector x to calculate a residuals vector b, and generates a weight vector W so as to be inversely proportional to the residuals vector b.

Further, the parameter estimator 130 numerically calculates a first partial derivative Jacobian of the residuals vector b by a preset method. Here, the residuals vector b may be considered as an error variance between the estimated value vector and the measured value vector.

In this case, the parameter estimator 130 estimates the SOH, and updates the estimated SOH until a weighted least square sum is no longer decreased by a Jacobian vector J within the maximum number of iterations. As such, the reason of limiting the number of iterations is to complete the parameter estimation before the charging of the battery is completed. For reference, a parameter estimable time is decreased according to a lifespan of the battery due to the limit of the number of iterations.

As the parameter estimator 130 performs the SOH estimation by updating the estimated SOH, if the weighted least square sum is converged or is the maximum number of iterations, the parameter estimator 130 estimates the estimated SOH as the SOH of the battery.

The parameter estimator 130 may perform the parameter estimation process described above for all selected cells (e.g., three cells). However, since a cell having the maximum voltage among the three cells first arrives at a target voltage, this cell is the most aged cell having the smallest present capacity. Accordingly, the parameter estimator 130 may determine the SOH estimated value of the cell having the maximum voltage as the SOH of the battery.

Alternatively, the parameter estimator 130 may also check an SOH deviation of the battery cell using a deviation of the SOH estimated value of the three cells. In this case, the parameter estimator 130 may also provide the SOH deviation to a user through a dash board, or the like.

Figure 6:
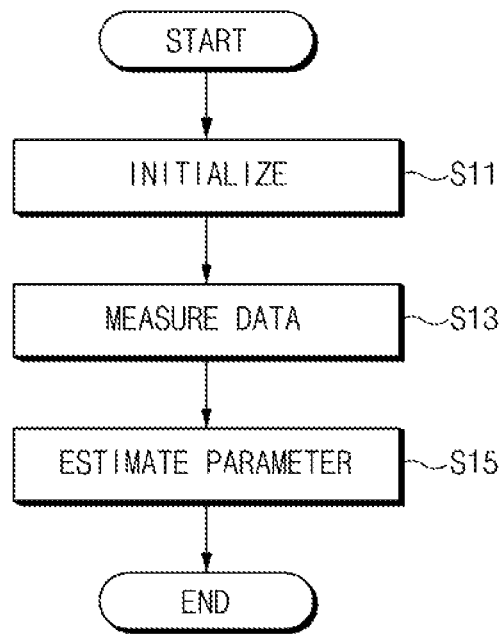
FIG. 6 is a flowchart illustrating a method for estimating an SOH of a battery of a system for estimating an SOH of a battery according to an exemplary embodiment of the present disclosure.

FIG. 6 is a flowchart illustrating a method for estimating an SOH of a battery of a system for estimating an SOH of a battery according to an exemplary embodiment of the present disclosure.

Referring to FIG. 6, first, the system for estimating an SOH of a battery is initialized (S11).

Next, the data measurer of the system for estimating an SOH of a battery measures data (S13).

That is, the system for estimating an SOH of a battery measures a charging required time required for a battery voltage to be changed (e.g., charged) by a preset voltage interval in a preset voltage range at the time of charging the battery.

Next, the parameter estimator of the system for estimating an SOH of a battery estimates a parameter (e.g., the SOH of the battery) (S15).

That is, the system for estimating an SOH of a battery estimates the parameter after a collection of the charging required time for the preset voltage range on the charging curve is completed.

Figure 7:
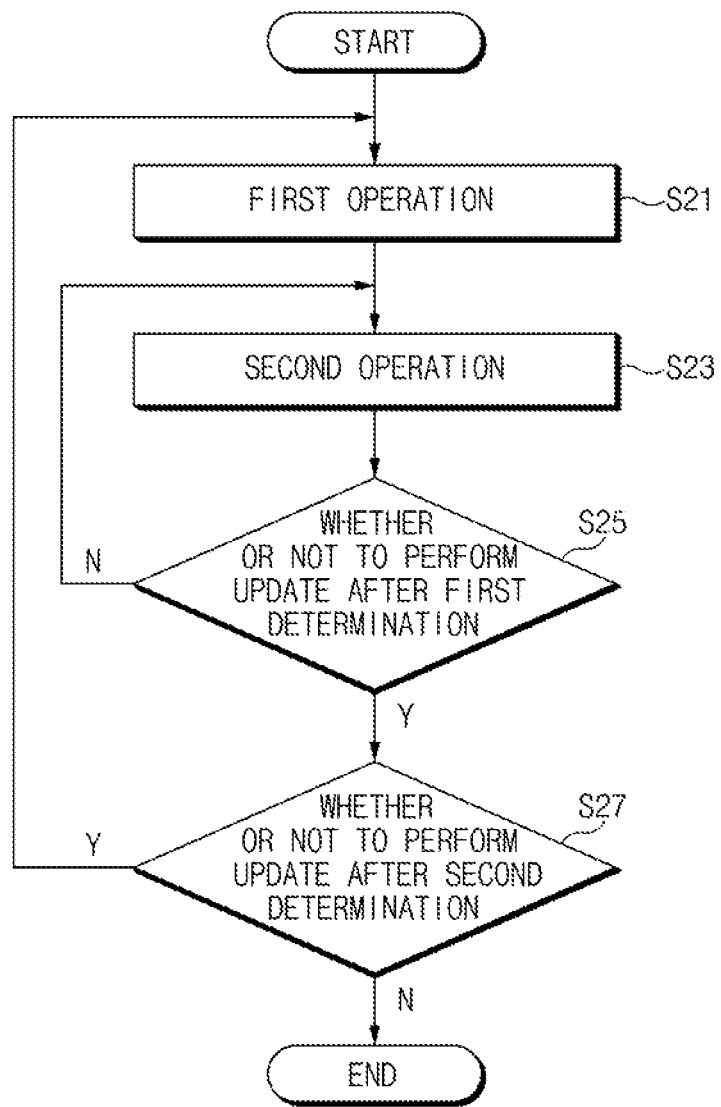
FIG. 7 is a flowchart schematically illustrating a method for estimating a parameter in a parameter estimator according to an exemplary embodiment of the present disclosure.

FIG. 7 is a flowchart schematically illustrating a method for estimating a parameter in a parameter estimator according to an exemplary embodiment of the present disclosure.

Referring to FIG. 7, the parameter estimator updates an initial measured value vector y to which a charging start time is added to a measured value vector y (e.g., a measured value of the charging required time), which is a first operation (S21).

Figure 8:
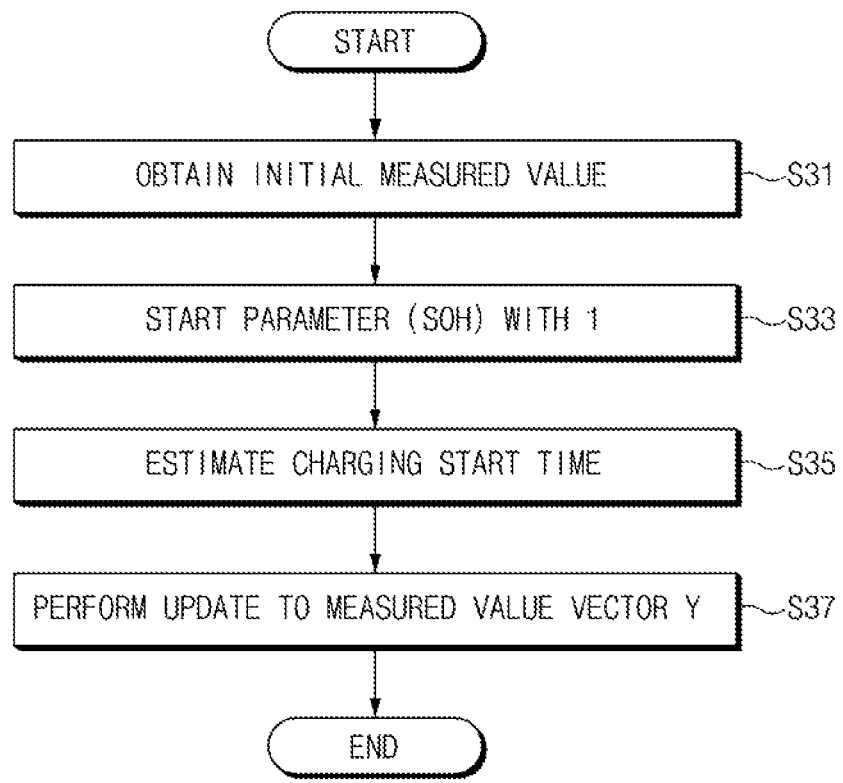
FIG. 8 is a first flowchart illustrating a method for estimating a parameter of a system for estimating an SOH of a battery according to an exemplary embodiment of the present disclosure.

Here, in S21, the system for estimating an SOH of a battery obtains an initial measured value (e.g., the initial measured value vector y) according to a first flowchart of FIG. 8.

In addition, the system for estimating an SOH of a battery starts with a parameter (e.g., a predicted SOH) having 1.

Next, the system for estimating an SOH of a battery estimates the charging start time.

That is, the system for estimating an SOH of a battery assumes the estimated SOH to 1 initially after the parameter estimation starts, and stores the charging required time, which is a result obtained by converting the charging curve of the estimated SOH of 1 according to the estimated charging start time, in the estimated value vector x.

Next, the system for estimating an SOH of a battery updates the initial measured value vector y to which the charging start time is added, to the measured value vector y.

Such S21 will be described by a graph using detailed numeric values in the following FIG. 10A.

Next, the parameter estimator estimates the SOH of the battery, and updates the estimated SOH (e.g., the predicted SOH) until a weighted least square sum is no longer decreased by a Jacobian vector J within the maximum number of iterations, which is a second operation (S23).

Figure 9:
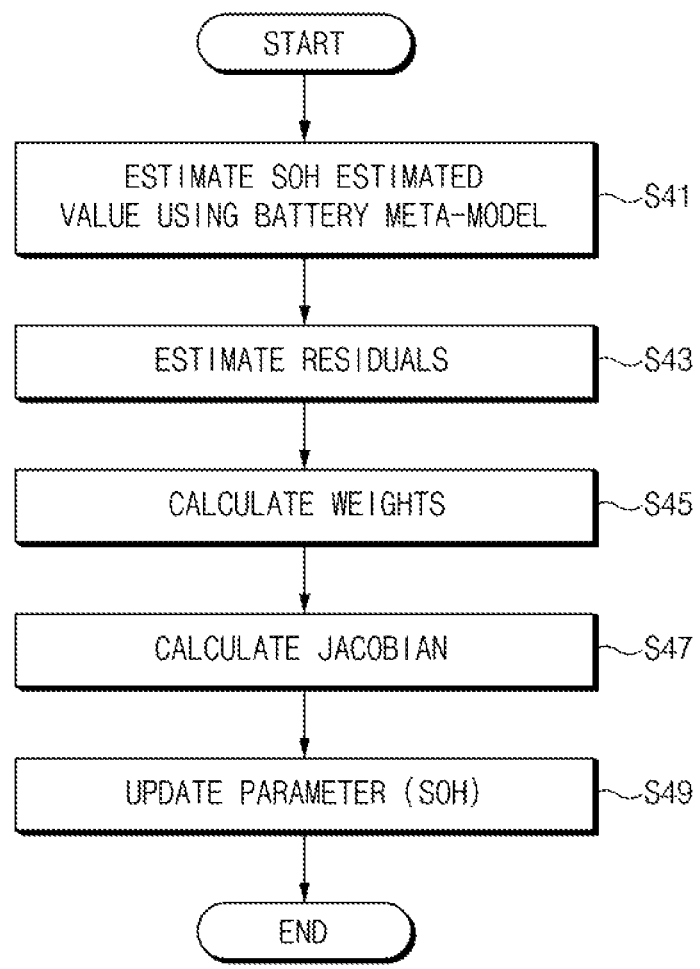
FIG. 9 is a second flowchart illustrating a method for estimating a parameter of a system for estimating an SOH of a battery according to an exemplary embodiment of the present disclosure.

Here, in S23, the system for estimating an SOH of a battery estimates an SOH estimated value (e.g., an estimated value of the charging required time) using the battery meta-model according to a second flowchart of FIG. 9.

That is, the system for estimating an SOH of a battery predicts the charging required time of each of the measurement points of the charging curve by the battery meta-model and stores the predicted charging required time in an estimated value vector x.

Next, the system for estimating an SOH of a battery subtracts the measured value vector y from the estimated value vector x to thereby estimate a residuals vector b.

Next, the system for estimating an SOH of a battery calculates a weight vector w so as to be inversely proportional to the residuals vector b.

Next, the system for estimating an SOH of a battery calculates a first partial derivative Jacobian of the residuals vector b by a preset method.

Next, the system for estimating an SOH of a battery estimates the parameter (SOH), and updates a finally estimated parameter (SOH) until a weighted least square sum is no longer decreased by a Jacobian vector J.

Here, S21, S23, S25 and S27 will be described by a graph using detailed numerical values in the following FIGS. 10A and 10C.

Next, the parameter estimator determines whether or not to continue to update the estimated SOH (e.g., 1, 0.973, 0.949, 0.854, etc.), and continues to update the estimated SOH to approach (e.g., converge) the estimated SOH until the estimated SOH becomes a certain value (e.g., the SOH of 0.79).

That is, the parameter estimator compares the estimated SOH with the updated measured value vector y (e.g., the measured value of the charging required time), and approaches the estimated SOH until the estimated SOH becomes a value having low error of the updated measured value vector y.

Next, after S25, the parameter estimator determines whether or not to perform the update to the measured value vector y (e.g., from 598 seconds to 956 seconds of the measured value of the charging required time) updated in the first operation (S27).

That is, in S27, the parameter estimator determines whether or not to perform the update, and completes the parameter estimation when it is determined that error between the updated measured value vector y and the estimated SOH is lower than a preset value.

However, when it is determined that the error between the updated measured value vector y and the estimated SOH is higher than the set value, the parameter estimation continues to be performed.

That is, the parameter estimator may iterate the first operation and the second operation numerous times to continue to update the estimated SOH, and as the parameter estimator performs the SOH estimation, if the weighted least square sum is converged or is the maximum number of iterations, the parameter estimator may estimates the estimated SOH as the SOH of the battery.

FIG. 8 is a first flowchart illustrating a method for estimating a parameter of a system for estimating an SOH of a battery according to an exemplary embodiment of the present disclosure.

Referring to FIG. 8, the system for estimating an SOH of a battery obtains an initial measured value (e.g., an initial measured value vector y) (S31).

The system for estimating an SOH of a battery brings a measured value of the charging required time of each of the battery cells from the storage. In this case, the system for estimating an SOH of a battery configures the initial measured value vector y using data from the storage.

Next, the system for estimating an SOH of a battery starts with a parameter (e.g., a predicted SOH) having 1 (S33).

Next, the system for estimating an SOH of a battery estimates the charging start time (S35).

That is, the system for estimating an SOH of a battery assumes the estimated SOH to 1 initially after the parameter estimation starts, and stores the charging required time, which is a result obtained by converting the charging curve of the estimated SOH of 1 according to the estimated charging start time, in the estimated value vector x.

Next, the system for estimating an SOH of a battery updates the initial measured value vector y to which the charging start time is added to the measured value vector y (S37).

FIG. 9 is a second flowchart illustrating a method for estimating a parameter of a system for estimating an SOH of a battery according to an exemplary embodiment of the present disclosure.

Referring to FIG. 9, the system for estimating an SOH of a battery estimates an SOH estimated value (e.g., an estimated value of the charging required time) using the battery meta-model (S41).

That is, the system for estimating an SOH of a battery predicts the charging required time of each of the measurement points of the charging curve by the battery meta-model and stores the predicted charging required time in an estimated value vector x.

Next, the system for estimating an SOH of a battery subtracts the measured value vector y from the estimated value vector x to thereby estimate a residuals vector b (S43).

Next, the system for estimating an SOH of a battery calculates a weight vector w so as to be inversely proportional to the residuals vector b (S45).

Next, the system for estimating an SOH of a battery calculates a first partial derivative Jacobian of the residuals vector b by a preset method (S47).

Next, the system for estimating an SOH of a battery estimates the parameter (SOH), and updates a finally estimated parameter (SOH) until a weighted least square sum is no longer decreased by a Jacobian vector J (S49).

FIGS. 10A to 10E are graphs illustrating a change of a battery charging curve over a voltage and a time according to an exemplary embodiment of the present disclosure.

Figure 10A:
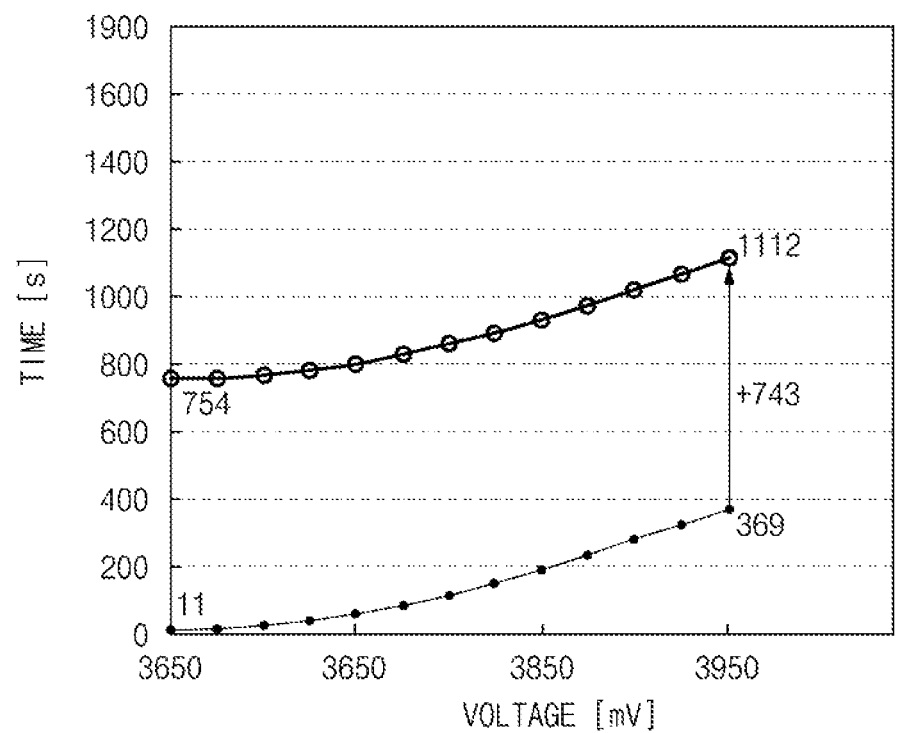
FIGS. 10A to 10E are graphs illustrating a change of a battery charging curve over a voltage and a time according to an exemplary embodiment of the present disclosure.

Referring to FIG. 10A, the system for estimating an SOH of a battery configures a measured value vector y using data from the storage.

In a method for configuring the measured value vector y, 11 seconds to 369 seconds from a voltage of 3650 mV to a voltage of 3950 mV are required after starting the charging of the battery.

Here, the system for estimating an SOH of a battery initially estimates the estimated SOH as 1, and updates the initial measured value vector y to which the charging start time (e.g., a start point of the charging curve or residual capacity) is added to a new measured value vector y.

A method for updating the initial measured value vector to the measured value vector y may be calculated using the above Equation 3.

That is, the residual capacity (e.g., the start point of the charging curve) may be calculated in SOC×SOH×nominal capacity.

For example, as illustrated in FIG. 10A, a charging start time may be estimated as SOC (0.3)×SOH (1)×nominal capacity (42 Ah)/current (61 A)×3600=743 seconds.

Here, 11 seconds to 369 seconds from the voltage of 3650 mV to the voltage of 3950 mV are required after starting the charging of the battery, but 743 seconds are each added thereto, such that 754 seconds and 1112 seconds may be required.

Figure 10B:
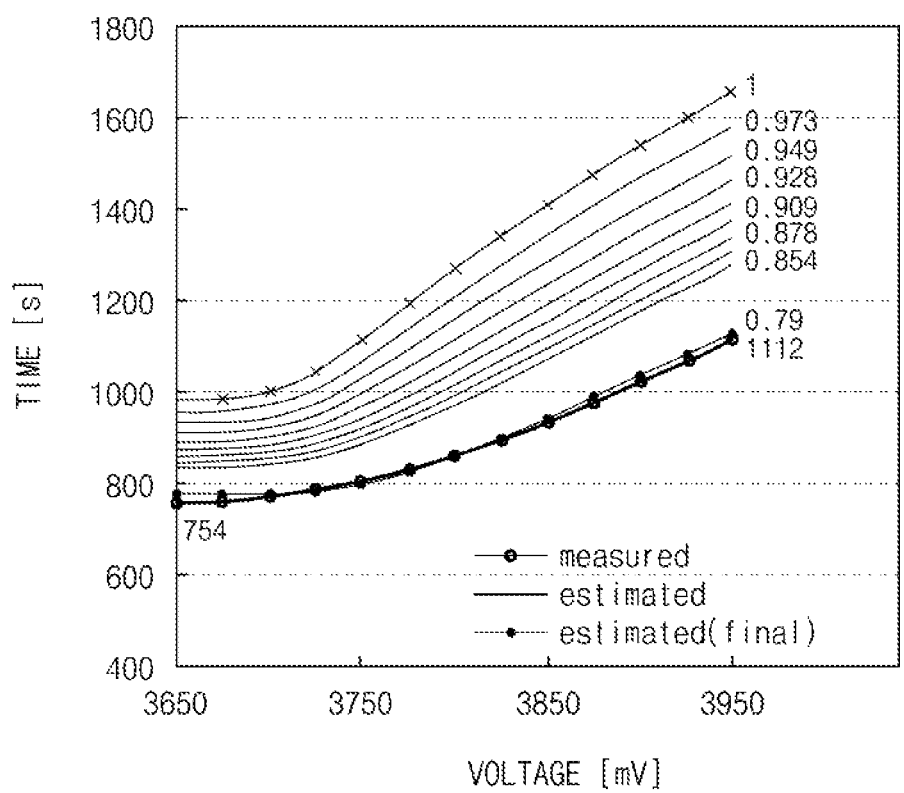

Referring to FIG. 10B, the SOH obtained from a time elapsed to arrive at a target voltage is disclosed.

As illustrated in FIG. 10B, while the SOH is changed from 1 to 0.79, the estimated value vector x approaches (e.g., converges) the measured value vector y of which a charging start time is 754 seconds and a charge complete time is 1112 seconds.

Figure 10C:
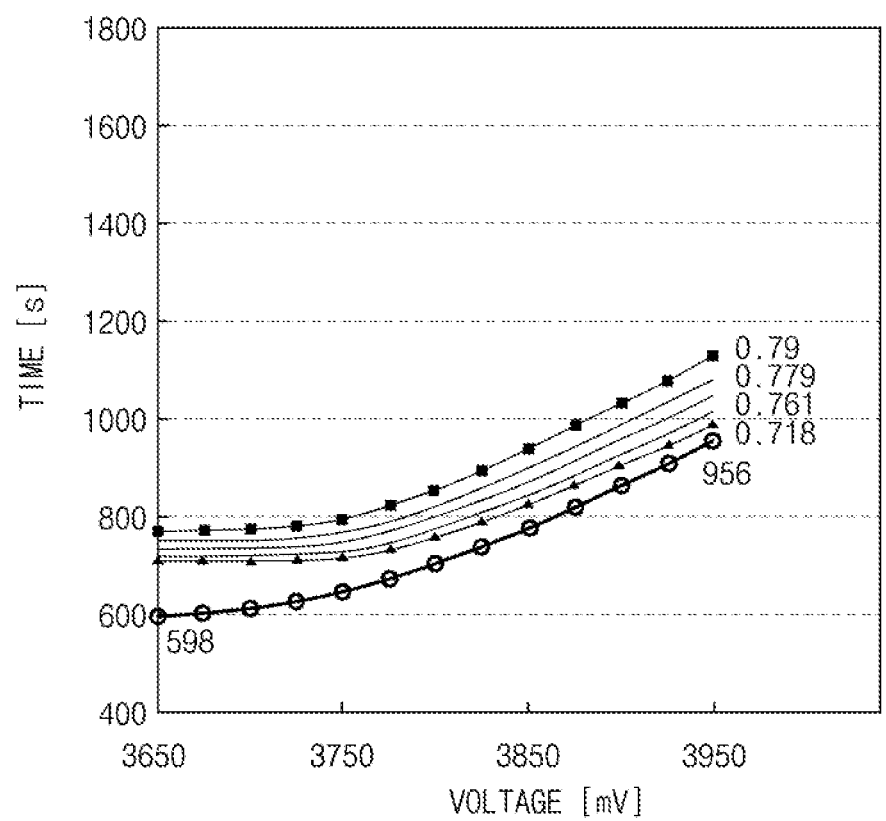

As illustrated in FIG. 10C, while the SOH is changed from 0.79 to 0.718, the estimated value vector x approaches the measured value vector y of which the charging start time is 598 seconds and the charge complete time is 956 seconds.

Figure 10D:
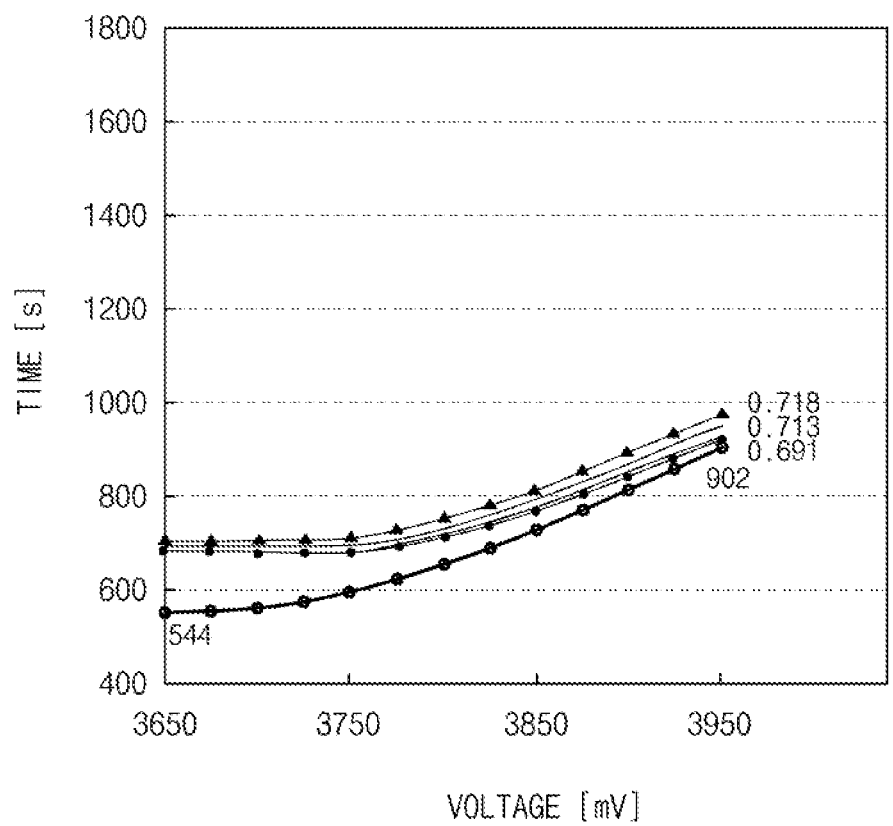

As illustrated in FIG. 10D, while the SOH is changed from 0.718 to 0.691, the estimated value vector x approaches the measured value vector y of which the charging start time is 544 seconds and the charge complete time is 902 seconds.

Figure 10E:
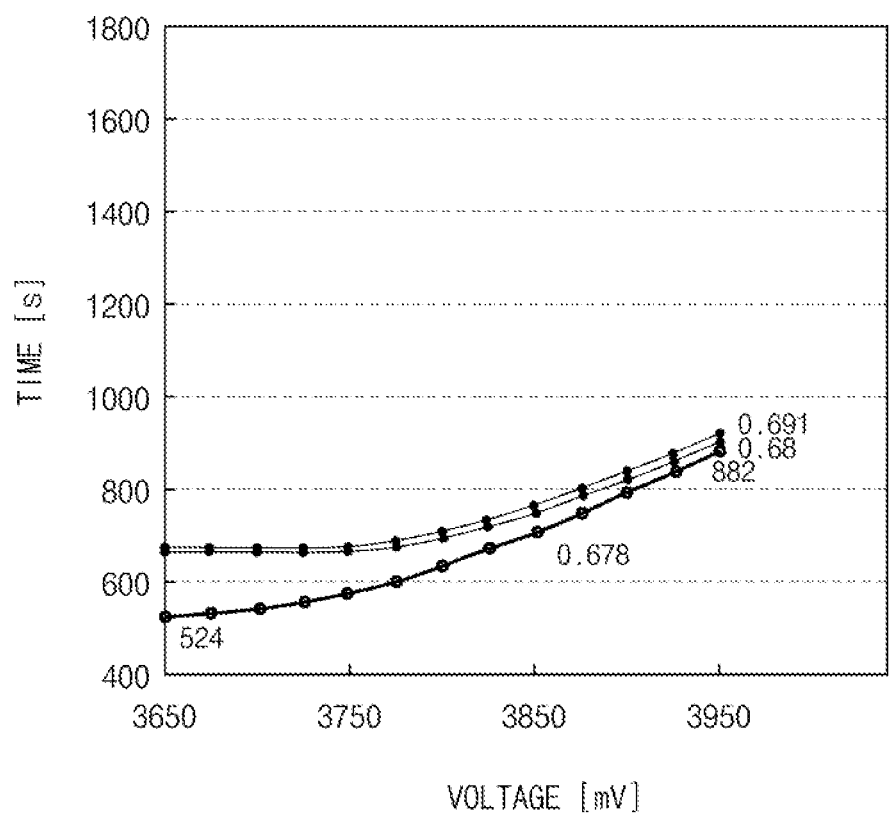

As illustrated in FIG. 10E, while the SOH is changed from 0.691 to 0.68, the estimated value vector x approaches the measured value vector y of which the charging start time is 524 seconds and the charge complete time is 882 seconds.

As described above, the system for estimating an SOH of a battery according to an exemplary embodiment of the present disclosure uses a method capable of estimating the SOH of the battery while the SOH of the battery converges on a root of equation, such as a fixed-point iteration.

That is, in the case in which an actual SOH is measured up to 67.8%, since the estimated value of the SOH is 68%, the system for estimating an SOH of a battery may calculate estimation error within 0.2%.

Figure 11:
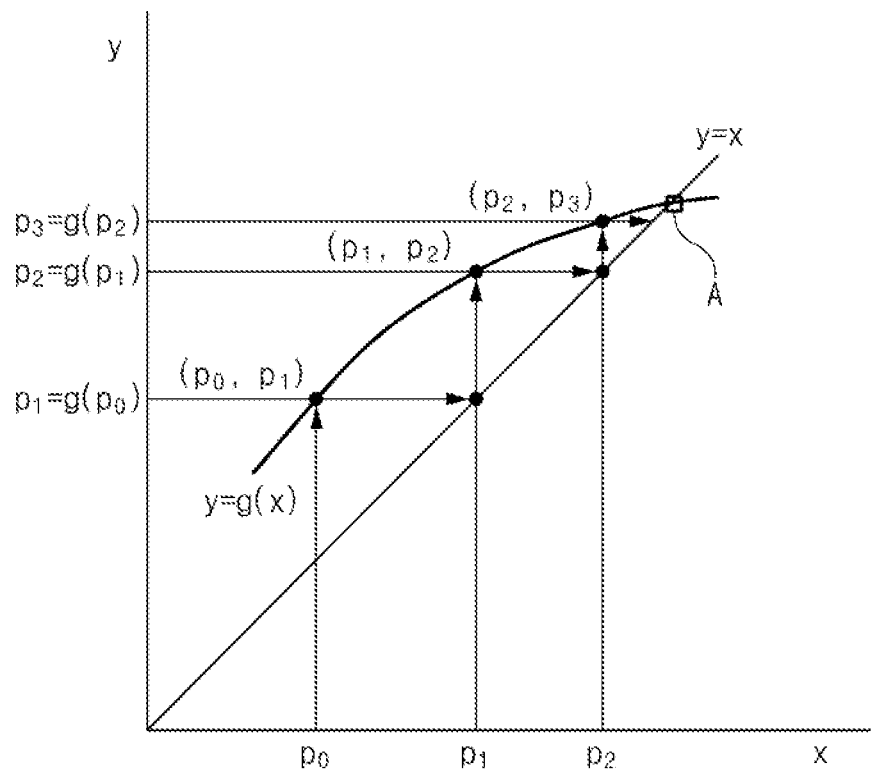
FIG. 11 is a graph illustrating a fixed-point iteration according to an exemplary embodiment of the present disclosure.

FIG. 11 is a graph illustrating a fixed-point iteration according to an exemplary embodiment of the present disclosure.

Referring to FIG. 11, a method for estimating an SOH of a battery according to an exemplary embodiment of the present disclosure is a method for estimating the SOH of the battery in a method such as the fixed-point iteration.

Here, the fixed-points may be estimated by a method for calculating roots of equations.

The above-mentioned method is a method of iteratively calculating the fixed-points until the fixed-point within an allowable error range is estimated in order to obtain a final fixed-point A in a graph of y=x of FIG. 11. Here, x may be p0, p1, p2, etc., and the fixed-points in y=g(x) may be (p0, p1), (p1, p2), (p2, p3), etc.

For example, in the fixed-point iteration, if y=x is deformed to an equation of x=g(x) in order to find x satisfying f(x)=0, f(x)=x−sin x=0, and x=sin x=g(x) may be derived.

Here, since x=g(x), p1, p1, or p2 may be g(p0), g(p1), or g(p2), respectively, such that the fixed-point p1 rather than the fixed-point (p0, p1) may be estimated as a closer fixed-point, the fixed-point (p1, p2) rather than the fixed-point p1 may be estimated as the closer fixed-point, and the fixed-point p2 rather than the fixed-point (p1, p2) may be estimated as the closer fixed-point.

Figure 12:
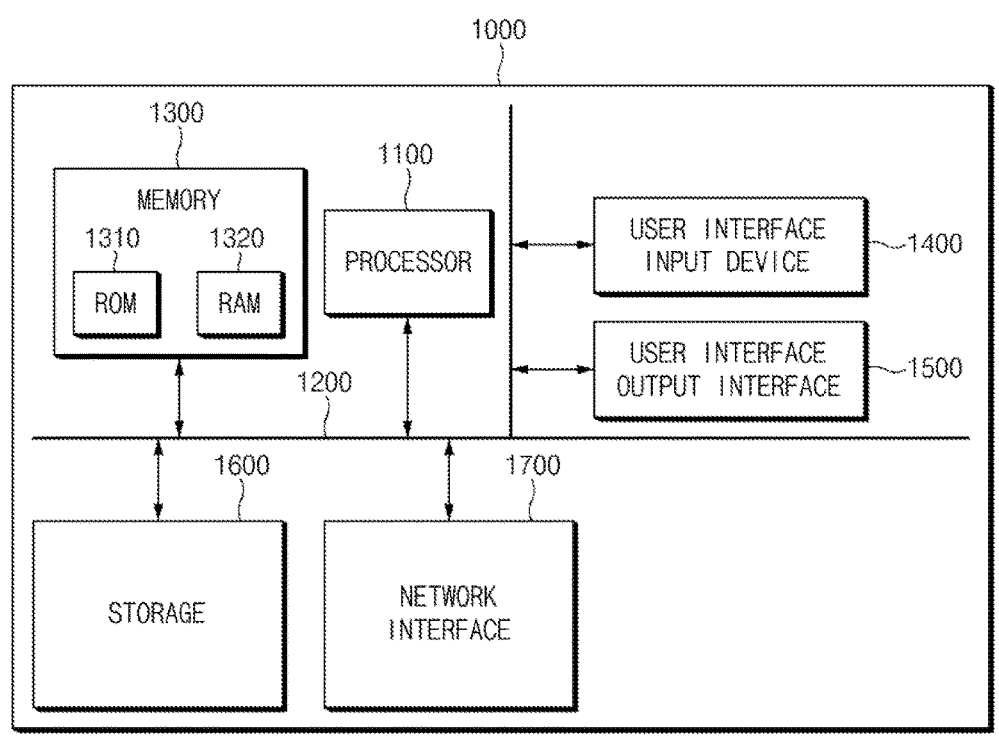
FIG. 12 is a block diagram illustrating a computing system that executes the method for estimating an SOH of a battery according to an exemplary embodiment of the present disclosure.

FIG. 12 is a block diagram illustrating a computing system that executes the method for estimating an SOH of a battery according to an exemplary embodiment of the present disclosure.

Referring to FIG. 12, a computing system 1000 may include at least one processor 1100, a memory 1300, a user interface input device 1400, a user interface output device 1500, a storage 1600, and a network interface 1700 which are connected through a bus 1200.

The processor 1100 may be a central processing unit (CPU) or a semiconductor device executing processes for instructions which are stored in the memory 1300 and/or the storage 1600. The memory 1300 and the storage 1600 may include various kinds of volatile or non-volatile storing media. For example, the memory 1300 may include a read only memory (ROM) and a random access memory (RAM).

Accordingly, steps in the method or algorithm which is described in connection with the exemplary embodiments disclosed in the present specification may be directly implemented in hardware, a software module, or a combination thereof which is executed by the processor 1100. The software module may be resided on a storing medium (e.g., the memory 1300 and/or the storage 1600) such as a random access memory (RAM) memory 1320, a flash memory, a read only memory (ROM) memory 1310, an erasable programmable read only memory (EPROM) memory, an electrically erasable programmable read only memory (EEPROM) memory, a register, a hard disk, a removable disk, or a compact disc-read only memory (CD-ROM). An illustrative storing medium may be coupled to the processor 1100 and the processor 1100 may read information from the storing medium and write the information into the storing medium. Alternatively, the storing medium may also be integral with the processor 1100. The processor and the storing medium may also be resided within an application specific integrated circuit (ASIC). The ASIC may also be resided within a user terminal. Alternatively, the processor and the storing medium may also be resided within the user terminal as an individual component.

As described above, according to the exemplary embodiments of the present disclosure, an aging state of the battery may be easily estimated.

Further, in the case in which the battery is replaced or the battery management system is replaced, the mismatching phenomenon between the actual capacity of the battery and the previous SOH (the past SOH) stored in the battery management system may be prevented.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

What is claimed is:

1. A method for estimating a state of health (SOH) of a battery, the method comprising:
    calculating a measured value of a charging required time for each voltage interval of preset voltage intervals in a preset voltage range in which the battery is charged;

calculating, by a preset battery meta-model, an estimated value of the charging required time for each voltage interval of the preset voltage intervals; and estimating the SOH having a lowest error between the measured value of the charging required time and the estimated value of the charging required time by allowing the estimated value of the charging required time to iteratively approach the measured value of the charging required time by updating the SOH using fixed-point iteration until a weighted least square sum of a residuals vector is no longer decreased by a Jacobian vector within a maximum number of iterations, wherein the calculating of the estimated value of the charging required time comprises calculating the estimated value of the charging required time by changing a charging curve of a predicted SOH so as to correspond to a charging start time, wherein the residuals vector is calculated by subtracting the measured value of the charging required time from the estimated value of the charging required time.

2. The method of claim 1, wherein the preset voltage range is 3650 mV to 3950 mV, and wherein the voltage interval is 25 mV.

3. The method of claim 1, wherein the estimating of the SOH comprises:

obtaining an initial value of the measured value of the charging required time;

initializing the estimated SOH to 1;

calculating a charging start time of the battery; and updating the initial measured value to which the charging start time is added to the measured value of the charging required time.

4. The method of claim 3, wherein the preset voltage range is 3650 mV to 3950 mV, and wherein the voltage interval is 25 mV.

5. The method of claim 1, wherein, in the calculating of the measured value of the charging required time, cells having lowest, average, and maximum voltages among all cells configuring the battery are selected, and wherein the measured value of the charging required time for each of the voltage intervals is measured for the selected cells having the lowest, average, and maximum voltages, respectively.

6. The method of claim 5, wherein, in the estimating of the SOH having the lowest error between the measured value of the charging required time and the estimating value of the charging required time, (1) the SOH of the battery is estimated for the selected cells having the lowest, average, and maximum voltages, and (2) an SOH of the cell having the maximum voltage is determined as the SOH.

7. The method of claim 6, wherein the preset voltage range is 3650 mV to 3950 mV, and wherein the voltage interval is 25 mV.

8. The method of claim 1, wherein, in the estimating of the SOH having the lowest error between the measured value of the charging required time and the estimating value of the charging required time, (1) the SOH of the battery is estimated for cells having the lowest, average, and maximum voltages, and (2) an SOH of the cell having the maximum voltage is determined as the SOH.

9. The method of claim 8, wherein the preset voltage range is 3650 mV to 3950 mV, and wherein the voltage interval is 25 mV.

10. The method of claim 1, further comprising calculating the charging start time by converting a result obtained by dividing residual capacity by a charging current into a unit of second, before performing a constant current charging for the battery.

11. The method of claim 10, wherein the preset voltage range is 3650 mV to 3950 mV, and wherein the voltage interval is 25 mV.

12. The method of claim 1, wherein the preset voltage range is 3650 mV to 3950 mV, and wherein the voltage interval is 25 mV.

* * * * *